US005663698A

United States Patent [19]
Okada et al.

[11] Patent Number: 5,663,698
[45] Date of Patent: Sep. 2, 1997

[54] MAGNETOSTATIC WAVE DEVICE HAVING SLANTED END PORTIONS

[75] Inventors: Takekazu Okada; Satoru Shinmura; Fumio Kanaya; Shinichiro Ichiguchi, all of Nagaokakyo, Japan

[73] Assignee: Murata Manufacturing Co., Ltd., Kyoto-fu, Japan

[21] Appl. No.: 352,260

[22] Filed: Dec. 8, 1994

[30] Foreign Application Priority Data

Dec. 14, 1993 [JP] Japan ................ 5-343126

[51] Int. Cl.$^6$ .................. H01P 1/215
[52] U.S. Cl. .................. 333/202; 333/219.2
[58] Field of Search .................. 333/202, 219.2

[56] References Cited

U.S. PATENT DOCUMENTS

| | | | |
|---|---|---|---|
| 4,316,162 | 2/1982 | Volluet et al. | 333/201 |
| 5,017,895 | 5/1991 | Buck et al. | 333/202 X |
| 5,289,143 | 2/1994 | Tsutsumi | 333/204 |

FOREIGN PATENT DOCUMENTS

| | | | |
|---|---|---|---|
| 0132503 | 6/1988 | Japan. | |
| 0224404 | 9/1990 | Japan | 333/201 |

OTHER PUBLICATIONS

Miller, "Nondispersive Magnetostatic-Volume-Wave Delay Line," Sep. 2, 1976, *Electronics Letters*, vol. 12, No. 18, pp. 466-467.
Collins et al. "Magnetostatic Wave Terminations," *Journal of Applied Physics*, 49(3), Mar. 1978, pp. 1800-1802.

*Primary Examiner*—Benny Lee
*Assistant Examiner*—Justin P. Bettendorf
*Attorney, Agent, or Firm*—Jordan and Hamburg

[57] ABSTRACT

A magnetostatic wave device includes a dielectric substrate. Micro strip lines as transducers are formed by forming a ground electrode and strip-line electrodes, on both surfaces of the dielectric substrate. A ferrimagnetic base material formed with a GGG substrate and a YIG thin film on the GGG substrate is arranged on the strip-line electrodes. The ferrimagnetic base material is formed so that the end portions slant from the strip-line electrodes outwardly. The length of the ferrimagnetic base material is established to provide a minimum value.

10 Claims, 3 Drawing Sheets

MAGNETOSTATIC WAVE DEVICE HAVING SLANTED END PORTIONS

BACKGROUND OF THE INVENTION

1. Field of the Invention

The present invention relates to a magnetostatic wave device, and particularly to a magnetostatic wave device which is used as a filter or the like.

2. Description of the Prior Art

FIG. 7 is an illustrative view showing an example of a conventional magnetostatic wave device. A magnetostatic wave device 2 includes a dielectric substrate 1. As shown in FIG. 8, a ground electrode 3 and strip-line electrodes 4 are formed respectively on both surfaces of the dielectric substrate 2. Micro strip lines as transducers are made with the ground electrode 3 and the strip-line electrodes 4. One end of each of the two strip-line electrodes 4 are connected to the earth electrode 3 via an end face of the dielectric substrate 2. Other ends of the strip-line electrodes 4 are used respectively as an input terminal and an output terminal. A ferrimagnetic base material 5 is arranged on the strip-line electrodes 4. The ferrimagnetic base material 5 is made of a GGG (gadolinium gallium garnet) substrate 6 and a YIG (yttrium iron garnet) thin film 7 formed on the GGG substrate 6. The ferrimagnetic base material 5 is arranged so that the YIG thin film 7 is placed at the side of the strip-line electrodes 4.

When the magnetostatic wave device 1 is used, a magnetic field is supplied to the ferrimagnetic base material 5, and a signal is supplied to the strip-line electrode 4 which is used as an input side. A magnetostatic wave is excited by the input signal, and the magnetostatic wave is propagated on the YIG thin film 7. By receiving the propagated magnetostatic wave, an output signal is obtained from the strip-line electrode 4 which is used as an output side. The magnetostatic wave device 1 has a band-pass characteristics as shown in FIG. 9.

However, the conventional magnetostatic wave device is large, and can not satisfy the needs of miniaturization. Since the magnetostatic wave device is large, the material of the ferrimagnetic base material and the like is used in large quantities, resulting in high manufacturing cost.

SUMMARY OF THE INVENTION

It is, therefore, the primary object of the present invention to provide a magnetostatic wave device which is miniaturized, and has low manufacturing cost.

The present invention is directed to a magnetostatic wave device comprising a ferrimagnetic base material and two transducers formed on the ferrimagnetic base material.

The magnetostatic wave returned at an end of the ferrimagnetic base material is attenuated by slanting the ends of the ferrimagnetic base material against the transducers, or by putting a magnetostatic wave absorbers at the-ferrimagnetic base material portions out of the transducers. When the magnetostatic wave device has such structure, the operable features thereof are not impaired even when the ferrimagnetic base material portions extending behind the transducers are shortened.

According to the present invention, the magnetostatic wave device can be miniaturized, because the ferrimagnetic base material portions out of the transducers can be shortened. The quantities of the materials of the ferrimagnetic base material and the like can be reduced, because the magnetostatic wave device can be miniaturized, and resulting in low manufacturing cost.

The above and further objects, features, aspects and advantages of the present invention will be more fully apparent from the following detailed description with the accompanying drawings.

DESCRIPTION OF THE PREFERRED EMBODIMENTS

Figure 1:
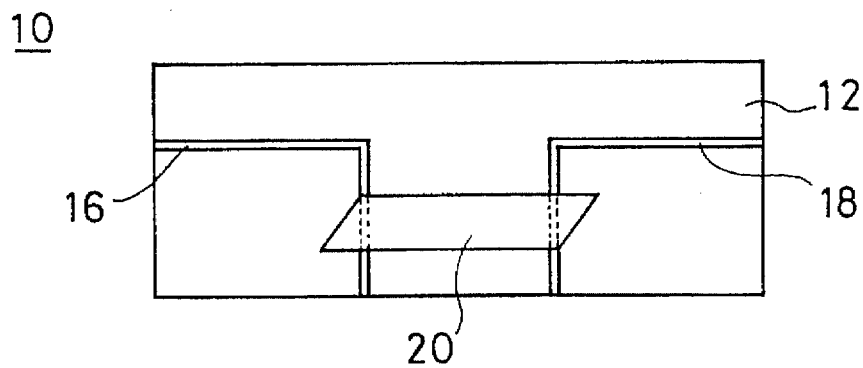
FIG. 1 is a plan view showing an embodiment of the present invention.
Figure 2:
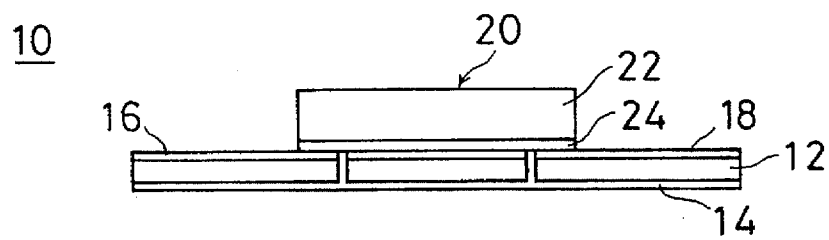
FIG. 2 is a side view showing the magnetostatic wave device shown in FIG. 1.

FIG. 1 is a plan view showing an embodiment of the present invention, and FIG. 2 is its side view. A magnetostatic wave device 10 includes a dielectric substrate 12. The dielectric substrate 12 is formed in a rectangular plate shape with, for example, dielectric ceramics. A ground electrode 14 is formed on one surface of the dielectric substrate 12. Two strip-line electrodes 16 and 18 are formed on the other surface of the dielectric substrate 12. The strip-line electrodes 16 and 18 extend from opposite ends to the center direction of the dielectric substrate 12, and extend toward the same direction to be led to the same end of the dielectric substrate 12. The strip-line electrodes 16 and 18 are connected to the ground electrode 14 via an end face of the dielectric substrate 12. Micro strip lines as transducers are made with the strip-line electrodes 16, 18 and the ground electrode 14.

A ferrimagnetic base material 20 is arranged on the strip-line electrodes 16 and 18. The ferrimagnetic base material 20 includes a GGG (gadolinium gallium garnet) substrate 22. A YIG (yttrium iron garnet) thin film 24 is formed on the GGG substrate 22. The YIG thin film 24 is arranged at the side of the strip-line electrodes 16 and 18. Both longitudinal ends of the ferrimagnetic base material 20 are formed so as to slant. At the strip-line electrode 16 side, the ferrimagnetic base material 20 is formed so as to slant from the outside portion of the strip-line electrode 16 outwardly. Similarly, at the strip-line electrode 18 side, the ferrimagnetic base material 20 is formed so as to slant from the outside portion of the strip-line electrode 18 outwardly.

A direct magnetic field is supplied to the ferrimagnetic base material 20 in the width direction. The direct magnetic field is supplied by arranging permanent magnets at both width sides of the ferrimagnetic base material 20. In this condition, when a signal is supplied to the strip-line electrode 16, a high frequency magnetic flux is generated around the strip-line electrode 16. A magnetostatic wave is excited by the high frequency magnetic flux, and the magnetostatic surface wave is propagated on the YIG thin film 24. When the magnetostatic wave is received, an output signal is obtained from the strip-line electrode 18.

Figure 3:
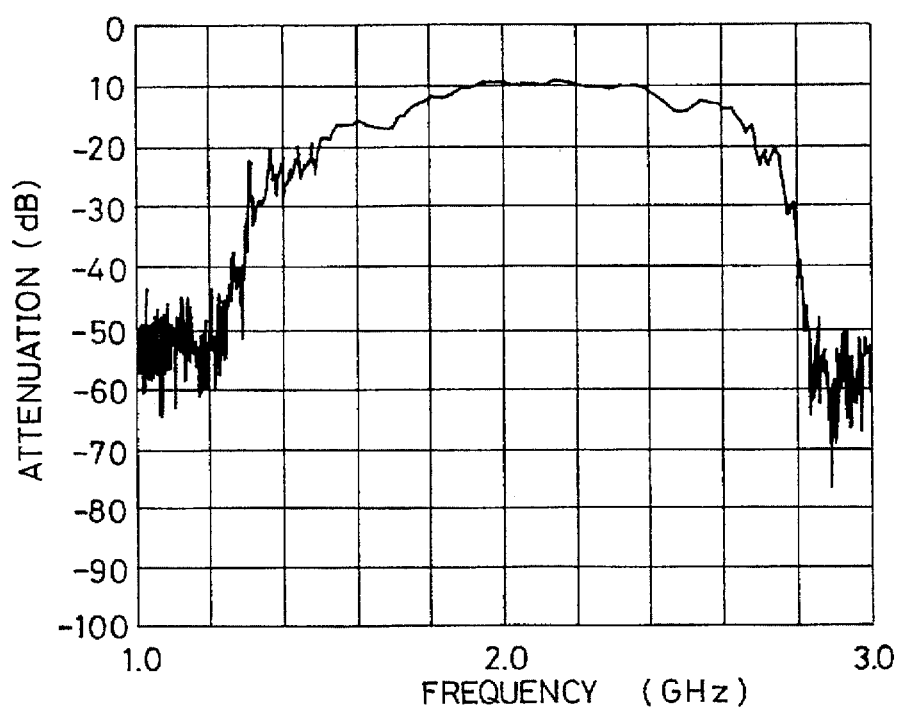
FIG. 3 is a graph showing band-pass characteristics of the magnetostatic wave device shown in FIG. 1.
Figure 9:
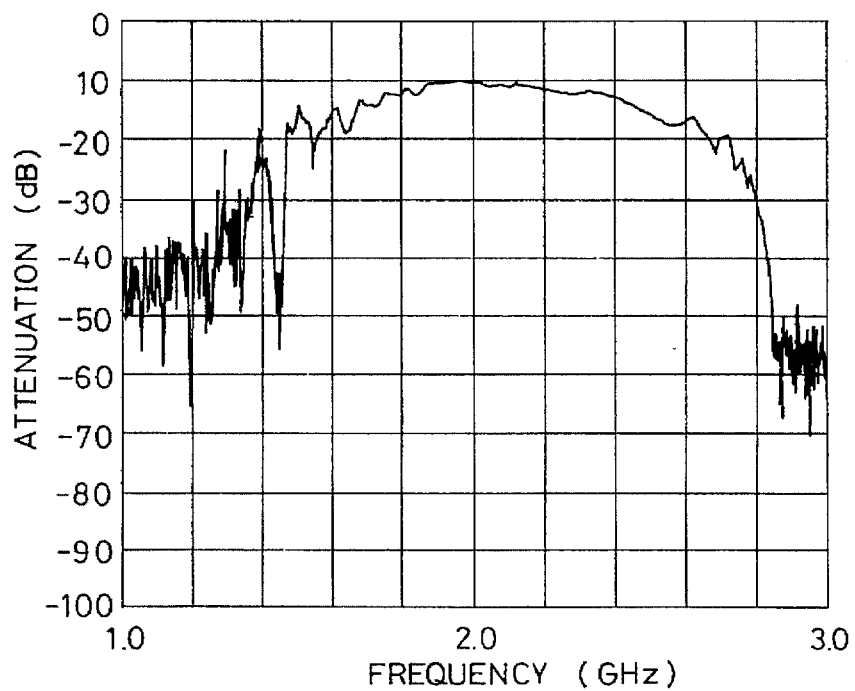
FIG. 9 is a graph showing a band-pass characteristics of the conventional magnetostatic wave device shown in FIG. 7.

In the magnetostatic wave device 10, the magnetostatic wave returned from the end of the ferrimagnetic base material 20 is attenuated, because the slant portion is formed at the end of the ferrimagnetic base material 20. Therefore, the deterioration of the characteristics of the magnetostatic wave device 10 due to the returned wave can be prevented. In the magnetostatic wave device 10, though the ferrimagnetic base material 20 has slant portions which slant from the strip-line electrodes 16, 18 portions outwardly, it is confirmed that the deterioration of the charactaristics is small as compared with the conventional magnetostatic wave device having a margin of the ferrimagnetic base material at the outside portion of the strip-line electrodes. A band-pass characteristic of the magnetostatic wave device 10 is shown in FIG. 3. In comparing FIG. 3 and FIG. 9, it will be seen that similar band-pass characteristics are obtained.

Figure 4:
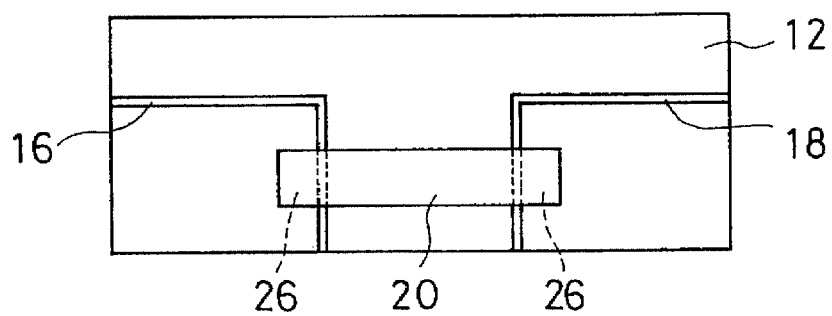
FIG. 4 is a plan view showing another embodiment of the present invention.
Figure 5:
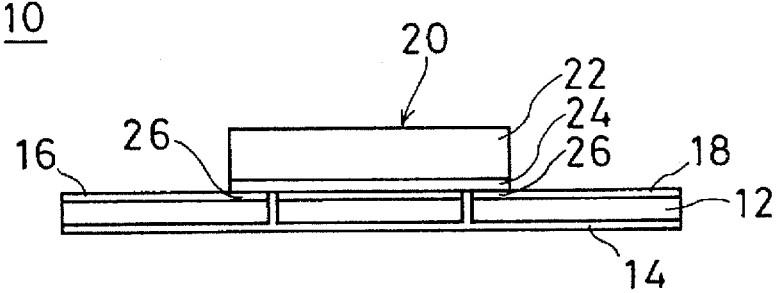
FIG. 5 is a side view showing the magnetostatic wave device shown in FIG. 4.
Figure 6:
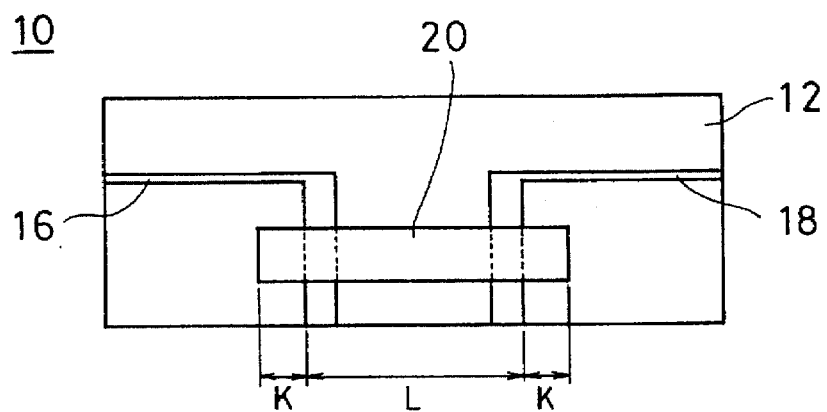
FIG. 6 is an illustrative view for explaining a length of a ferrimagnetic base material used in the magnetostatic wave device of the present invention.
Figure 7:
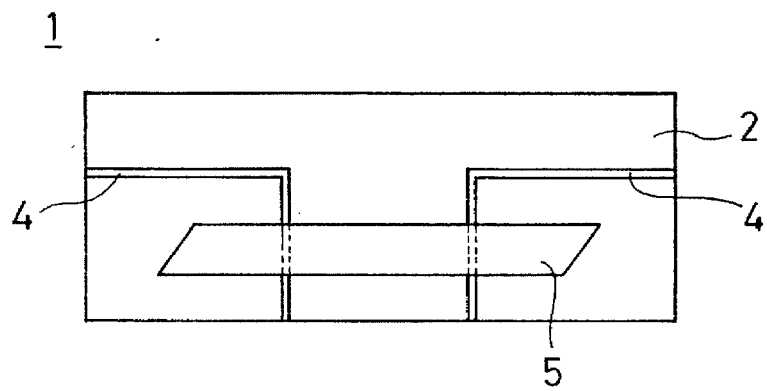
FIG. 7 is a plan view showing an example of a conventional magnetostatic wave device.
Figure 8:
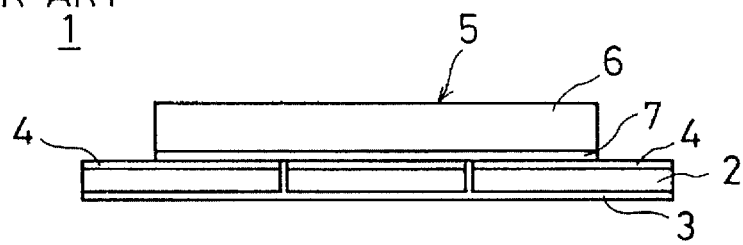
FIG. 8 is a side view showing the conventional magnetostatic wave device shown in FIG. 7.

As shown in FIG. 4 and FIG. 5, a magnetostatic wave absorber 26 may be applied under the ferrimagnetic base material 20 at the outside portions of the strip-line electrodes 16, 18 instead of the slant portion at the end of the ferrimagnetic base material 20. In such magnetostatic wave device 10, the magnetostatic wave returned at the end of the ferrimagnetic base material 20 can be attenuated, and good frequency characteristics can be obtained. The ferrimagnetic base material 20 portions at the outside of the strip-line electrodes 16, 18 can be shortened as compared with the conventional magnetostatic wave device. As shown in FIG. 6, the length of the ferrimagnetic base material 20 is the amount of the distance L between the outside of the strip-line electrodes 16, 18 and the length k of the portion for preventing the returned wave. It is discovered that the length of 1 mm is required for the length k at the minimum. Therefore, the minimum length of the ferrimagnetic base material 20 is L+1 mm.

In the embodiment of FIGS. 1 to 3, the distance from the outside of the strip-line electrodes 16, 18 to the furthermost outer end of the slanted portion may be 1 mm.

According to the present invention, since the length of the ferrimagnetic base material 20 is the minimum value, the magnetostatic wave device can be miniaturized. Since the magnetostatic wave device 10 can be miniaturized, the quantities of the materials of the ferrimagnetic base material 20 and the like can be controlled at the minimum value, and resulting in low manufacturing cost.

While the present invention has been particularly described and shown, it is to be understood that such description is used merely as an illustration and example rather than limitation, and the spirit and scope of the present invention is determined solely by the terms of the appended claims.

What is claimed is:

1. A magnetostatic wave device comprising:
a ferrimagnetic base material having a length and a width and having slant portions at both ends of the length direction of said ferrimagnetic base material, each of said slant portions having two spaced ends;
two transducers at a distance from each other being formed on said ferrimagnetic base material so as to extend in the width direction of said ferrimagnetic base material, each of said transducers having an outside edge extending in a width direction of said ferrimagnetic base material;
each started portion having one of said ends positioned on said outside edge of each of said transducers, the other of said ends of each of said slant portions being positioned at a distance from said outside edges of each of said transducers.

2. A magnetostatic wave device in accordance with claim 1 wherein a distance between the outside edge of each of said transducers and the other end of each of said slant portions is 1 mm.

3. A magnetostatic wave device in accordance with claim 1 wherein said ferrimagnetic base material is made of GGG (gadolinium gallium garnet) substrate and a YIG (yttrium iron garnet) thin film on said GGG substrate.

4. A magnetostatic wave device in accordance with claim 3 wherein a distance between the outside edge of each of said transducers and the other end of each of said slant portions is 1 mm.

5. A magnetostatic wave device in accordance with claim 1 wherein said transducers are made of a ground electrode on one surface of a dielectric substrate and two strip-line electrodes on another surface of said dielectric substrate.

6. A magnetostatic wave device in accordance with claim 5 wherein a distance between the outside edge of each of said transducers and the other end of each of said slant portions is 1 mm.

7. A magnetostatic wave device comprising:
a ferrimagnetic base material extending in a longitudinal direction, said ferrimagnetic base material having side borders and slanted end borders which extend between said side borders in a non-perpendicular direction relative to said longitudinal direction;
two transducers formed on said ferrimagnetic base material, each of said two transducers having transverse sides spaced from one another and extending perpendicular to said longitudinal direction;
each of said slanted end borders having one end intersecting one of said side borders of said ferrimagnetic base material at first positions and another end intersecting said other of said side borders of said ferrimagnetic base material at second positions;
said first positions being disposed on respective transverse sides of said transducers, said second positions being spaced from respective transverse sides of said transducers.

8. A magnetostatic wave device according to claim 7 wherein there is a space between said transverse sides of said transducers, said ferrimagnetic base material extending longitudinally along said space between spaced said transverse sides of said transducers.

9. A magnetostatic wave device according to claim 7 wherein the distance between each respective second position and each respective transducer side is 1 mm.

10. A magnetostatic wave device according to claim 7 wherein the distance between each respective second position and each respective transducer side measured parallel to said longitudinal direction is 1 mm.

* * * * *

UNITED STATES PATENT AND TRADEMARK OFFICE
CERTIFICATE OF CORRECTION

PATENT NO. : 5,663,698
DATED : September 2, 1997
INVENTOR(S) : Takekazu OKADA et al.

It is certified that error appears in the above-identified patent and that said Letters Patent is hereby corrected as shown below:

Column 4, line 7, change "started" to --slanted--.

Signed and Sealed this

Twenty-third Day of March, 1999

Attest:

Q. TODD DICKINSON

*Attesting Officer*     *Acting Commissioner of Patents and Trademarks*